(12) United States Patent
Wang et al.

(10) Patent No.: US 11,271,046 B2
(45) Date of Patent: Mar. 8, 2022

(54) OLED DISPLAY PANEL, METHOD FOR MANUFACTURING THE SAME AND OLED DISPLAY DEVICE

(71) Applicant: BOE TECHNOLOGY GROUP CO., LTD., Beijing (CN)

(72) Inventors: Tao Wang, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/902,022

(22) Filed: Jun. 15, 2020

(65) Prior Publication Data
US 2020/0312921 A1 Oct. 1, 2020

Related U.S. Application Data

(63) Continuation of application No. 15/962,535, filed on Apr. 25, 2018, now abandoned.

(30) Foreign Application Priority Data

Aug. 2, 2017 (CN) .......................... 201710651391.7

(51) Int. Cl.
*H01L 27/32* (2006.01)
*H01L 51/52* (2006.01)
(Continued)

(52) U.S. Cl.
CPC ...... *H01L 27/3206* (2013.01); *H01L 51/5221* (2013.01); *H01L 51/5265* (2013.01);
(Continued)

(58) Field of Classification Search
CPC ... H01L 51/5265–5275; H01L 51/0097; H01L 2251/558; H01L 2251/5338; H01L 27/3206
See application file for complete search history.

(56) References Cited

U.S. PATENT DOCUMENTS 9,831,431 B2 11/2017 Yan et al.
10,054,988 B2 8/2018 Jin et al.
(Continued)

FOREIGN PATENT DOCUMENTS

| CN | 102855821 A | 1/2013 |
| CN | 104900678 A | 9/2015 |
| CN | 106340250 A | 1/2017 |

OTHER PUBLICATIONS

First Chinese Office Action dated Jul. 29, 2019, for corresponding Chinese Application No. 201710651391.7.
(Continued)

*Primary Examiner* — Aaron J Gray
(74) *Attorney, Agent, or Firm* — Kinney & Lange, P.A.

(57) ABSTRACT

An OLED display panel, a method for manufacturing the same and an OLED display device are disclosed. The OLED display panel comprises a flat region and a curved region, wherein the OLED display panel comprises a light-emitting element in the flat region and a light-emitting element in the curved region, each light-emitting element comprises a cathode and an anode, and a distance between the anode and the cathode of the light-emitting element in the curved region is greater than a distance between the anode and the cathode of the light-emitting element in the flat region.

8 Claims, 7 Drawing Sheets

(51) Int. Cl.
*H01L 51/56* (2006.01)
*H01L 51/00* (2006.01)

(52) U.S. Cl.
CPC .......... *H01L 51/56* (2013.01); *H01L 27/3244* (2013.01); *H01L 51/0097* (2013.01); *H01L 51/5275* (2013.01); *H01L 2227/323* (2013.01); *H01L 2251/5338* (2013.01); *H01L 2251/558* (2013.01)

(56) References Cited

U.S. PATENT DOCUMENTS

| | | |
|---|---|---|
| 10,199,441 B2 | 2/2019 | Liu et al. |
| 2013/0002133 A1 | 1/2013 | Jin et al. |
| 2014/0326957 A1* | 11/2014 | Lee ................. H01L 51/504 257/40 |
| 2014/0374707 A1 | 12/2014 | Seo et al. |
| 2015/0069341 A1 | 3/2015 | Kim et al. |
| 2016/0118612 A1 | 4/2016 | Park et al. |
| 2016/0240591 A1* | 8/2016 | Song ................. H01L 27/3211 |
| 2016/0343947 A1 | 11/2016 | Yan et al. |
| 2017/0062756 A1* | 3/2017 | Ahn ................. B32B 27/36 |
| 2017/0117333 A1* | 4/2017 | Kikuchi ............. G09F 9/30 |
| 2018/0033843 A1 | 2/2018 | Liu et al. |
| 2019/0013497 A1* | 1/2019 | So ................. H01L 51/5056 |

OTHER PUBLICATIONS

Second Chinese Office Action dated May 7, 2020, for corresponding Chinese Application No. 201710651391.7.

* cited by examiner

OLED DISPLAY PANEL, METHOD FOR MANUFACTURING THE SAME AND OLED DISPLAY DEVICE

CROSS-REFERENCE TO RELATED APPLICATION(S)

This application is a continuation of U.S. application Ser. No. 15/962,535, filed Apr. 25, 2018, which in turn claims the benefit of Chinese Patent Application No. 201710651391.7 entitled "OLED display panel, method for manufacturing the same and OLED display device" and filed on Aug. 2, 2017 in the State Intellectual Property Office of China, the whole disclosures of which are incorporated herein by reference.

BACKGROUND

Technical Field

The present disclosure relates to the field of display technologies, and in particular to an OLED display panel, a method for manufacturing the same and an OLED display device.

Description of the Related Art

With the development of display technology, folding display, curved display and other technologies have become the research focus in recent years. Taking curved display technology as an example, compared to a flexible liquid crystal display panel, a flexible OLED display panel has not only a self-luminous characteristic, but also may achieve a curved display with a smaller bending radius since the OLED display panel is prepared on a flexible substrate. Therefore, the flexible OLED display panel has been more widely used.

In general, a flexible OLED display panel usually has a curved edge. It is well known that there are different levels of microcavity effects in the light-emitting elements of an OLED display panel. With the microcavity effect, the densities of photon of different energy levels are redistributed, so that only light of a specific wavelength that conforms to a resonant cavity mode may be emitted out at a specific angle, resulting in a narrowing in half width of the light wave and changes in the light intensity and wavelength of the emitted light with the change of observation angles. In this case, when the edge of the OLED display panel is curved, the curved region of the OLED display panel has a larger observation angle for the user than that of the flat region, and the intensity and wavelength of the emitted light will change more significantly, resulting in a change in the spectral range. In this way, the user may view a color shift in an image observed in the curved region, thereby affecting the user's viewing experience.

SUMMARY

The present disclosure provides an OLED display panel, a method for manufacturing the same and an OLED display device so as to overcome at least part of the drawbacks in the prior art.

The embodiments of the present disclosure provide an OLED display panel comprising a flat region and a curved region, wherein the OLED display panel comprises a light-emitting element in the flat region and a light-emitting element in the curved region, each light-emitting element comprises a cathode and an anode, and a distance between the anode and the cathode of the light-emitting element in the curved region is greater than a distance between the anode and the cathode of the light-emitting element in the flat region.

In some embodiments of the present disclosure, at least one functional layer is formed between the anode and the cathode of the light-emitting element in the curved region; at least one functional layer is formed between the anode and the cathode of the light-emitting element in the flat region; and a total thickness of the at least one functional layer of the light-emitting element in the curved region is greater than a total thickness of the at least one functional layer of the light-emitting element in the flat region.

In some embodiments of the present disclosure, the functional layer of the light-emitting element in the flat region comprises a basic functional layer; the functional layer of the light-emitting element in the curved region comprises a basic functional layer; and the functional layer of the light-emitting element in the curved region further comprises a first thickening layer having a same function as a corresponding basic functional layer.

In some embodiments of the present disclosure, the first thickening layer has a single-layered film structure or a multi-layered film structure.

In some embodiments of the present disclosure, the basic functional layers having a same function in the curved region and the flat region are formed by one patterning process.

In some embodiments of the present disclosure, the same function is a light emitting function, an electron injection function, an electron transport function, a hole injection function, or a hole transport function.

In some embodiments of the present disclosure, at least one functional layer is formed between the anode and the cathode of the light-emitting element in the curved region; at least one functional layer is formed between the anode and the cathode of the light-emitting element in the flat region; and a second thickening layer is further formed between the anode and the cathode of the light-emitting element in the curved region.

In some embodiments of the present disclosure, the second thickening layer is located between the anode and the functional layer of the light-emitting element in the curved region, or the second thickening layer is located between the cathode and the functional layer of the light-emitting element in the curved region.

In some embodiments of the present disclosure, the second thickening layer is a grating.

In some embodiments of the present disclosure, the grating has a height of 50 nm to 60 nm, and the grating has a period of 1 μm to 10 μm.

In some embodiments of the present disclosure, the grating is filled with a hole injection material or a hole transport material, or the grating is filled with an electron injection material or an electron transport material.

In some embodiments of the present disclosure, the distance between the anode and the cathode of the light-emitting element in the curved region is 1.1 to 3 times the distance between the anode and the cathode of the light-emitting element in the flat region.

The embodiments of the present disclosure also provide a method for manufacturing an OLED display panel, wherein the OLED display panel comprises a flat region and a curved region, and the method comprises:

providing a substrate comprising a first region corresponding to the curved region of the OLED display panel and a second region corresponding to the flat region of the OLED display panel;

forming a light-emitting element in each of the first region and the second region on the substrate, a distance between an anode and a cathode of the light-emitting element in the first region being greater than a distance between an anode and a cathode of the light-emitting element in the second region.

In some embodiments of the present disclosure, the step of forming a light-emitting element in each of the first region and the second region on the substrate comprises:

forming the anode in each of the first region and second region on the substrate;

forming at least one functional layer on a surface of the anode in the first region facing away from the substrate, and at least one functional layer on a surface of the anode in the second region facing away from the substrate, a total thickness of the at least one functional layer formed on the anode in the first region being greater than a total thickness of the at least one functional layer formed on the anode in the second region;

forming the cathode on a surface of the functional layer in the first region facing away from the anode, and the cathode on a surface of the functional layer in the second region facing away from the anode.

In some embodiments of the present disclosure, the functional layer formed in the first region comprises a basic functional layer, and the functional layer formed in the second region comprises a basic functional layer, and the functional layer formed in the first region further comprises a first thickening layer having the same function as a corresponding basic functional layer.

In some embodiments of the present disclosure, the first thickening layer in the first region is formed by one or more patterning process; and the basic functional layers having a same function in the first region and the second region are formed by one patterning process.

In some embodiments of the present disclosure, the step of forming a light-emitting element in each of the first region and the second region on the substrate comprises:

forming an anode in each of the first region and the second region on the substrate;

forming a second thickening layer and at least one functional layer on a surface of the anode in the first region facing away from the substrate, and at least one functional layer on a surface of the anode in the second region facing away from the substrate;

forming a cathode on a surface of the second thickening layer and the at least one functional layer in the first region facing away from the anode, and a cathode on a surface of the functional layer in the second region facing away from the anode.

In some embodiments of the present disclosure, the step of forming a second thickening layer and at least one functional layer on a surface of the anode in the first region facing away from the substrate, and at least one functional layer on a surface of the anode in the second region facing away from the substrate comprises:

forming a second thickening layer on a surface of the anode in the first region facing away from the substrate; and forming at least one functional layer on a surface of the second thickening layer facing away from the anode, and at least one functional layer on a surface of the anode in the second region facing away from the substrate;

or forming at least one functional layer on a surface of the anode in the first region facing away from the substrate, and at least one functional layer on a surface of the anode in the second region facing away from the substrate; and forming a second thickening layer on a surface of the functional layer in the first region facing away from the anode.

In some embodiments of the present disclosure, the second thickening layer is a grating.

The embodiments of the present disclosure further provides an OLED display device comprising the OLED display panel according to the embodiments of the present disclosure.

BRIEF DESCRIPTION OF THE DRAWINGS

In order to more clearly explain the technical solutions of the embodiments of the present disclosure, the drawings cited in the description of the embodiments will be briefly described below. Obviously, the drawings described below are merely some embodiments of the present disclosure. For a person of ordinary skill in the art, other drawings may also be obtained based on these drawings without any creative work.

DETAILED DESCRIPTION OF PREFERRED EMBODIMENTS

To make the above objectives, features, and advantages of the present disclosure more comprehensible, the technical solutions in the embodiments of the present disclosure will be clearly and fully described in the following with reference to the accompanying drawings in the embodiments of the present disclosure. Obviously, the described embodiments are merely some but not all of the embodiments of the present disclosure. All other embodiments obtained by a person of ordinary skill in the art based on the embodiments of the present disclosure without creative efforts shall fall within the protection scope of the present disclosure.

In the OLED display panel provided in the present disclosure, a light-emitting element is provided in each of a flat region and a curved region, and a distance between an anode and a cathode of the light-emitting element in the curved region is greater than a distance between an anode and a cathode of the light-emitting element in the flat region. Since the microcavity in the light-emitting element may be regarded as a resonant cavity, the distance between the anode and the cathode of the light-emitting element may be regarded as the cavity length of the microcavity. Therefore, when the distance between the anode and the cathode of the light-emitting element in the curved region is increased with respect to the flat region, the cavity length of the microcavity of the light-emitting element in the curved region is accordingly increased. Based on the resonance principle of microcavity, when the cavity length of the microcavity is increased, light in a larger wavelength range may satisfy the resonance condition so as to be emitted out. In this way, when the user views the image at the observation angle corresponding to the curved region, the light in a larger spectral range may be observed, thereby at least partially overcoming the problem of spectrum movement under different observation angles due to the microcavity effect in the prior art and avoiding color shifts in the viewed image to a certain extent. Therefore, by using the OLED display panel provided by the present disclosure, the display effect of the curved region may be improved to a certain extent, thereby further improving the display performance of the OLED display panel.

Figure 2:
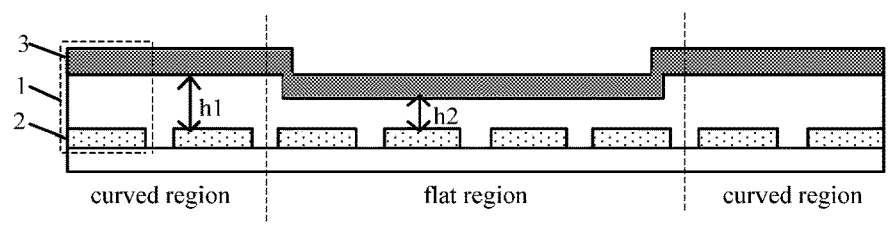
FIG. 2 is a schematic structural diagram of an OLED display panel according to an embodiment of the present disclosure.

As shown in FIG. 2, the present disclosure provides an OLED display panel. The OLED display panel comprises a curved region and a flat region, wherein the curved region of the OLED display panel is generally a peripheral region of the OLED display panel, and the flat region of the OLED display panel is usually the middle region of the OLED display panel (the middle region is the region surrounded by the peripheral region). The OLED display panel comprises a plurality of light-emitting elements 1 distributed in the flat region and the curved region; wherein a distance h1 between the anode 2 and the cathode 3 of the light-emitting element 1 in the curved region is greater than a distance h2 between the anode 2 and the cathode 3 of the light-emitting element 1 in the flat region.

It may be understood that the above light-emitting element 1 may be an organic light emitting diode. According to the light emitting characteristics of the organic light emitting diode, a microcavity may be formed between the anode 2 and the cathode 3 of the organic light emitting diode, and the distance between the anode 2 and the cathode 3 may be regarded as a cavity length of the microcavity. Since the microcavity may be regarded as a resonant cavity, based on the resonance principle of microcavity, when the distance between the anode 2 and the cathode 3 is increased, the cavity length of the microcavity is increased such that light of a larger wavelength may be emitted from the microcavity.

In the OLED display panel provided in the present disclosure, the distance h1 between the anode 2 and the cathode 3 of the light-emitting element 1 in the curved region is greater than the distance h2 between the anode 2 and the cathode 3 of the light-emitting element 1 in the flat region. That is, in comparison to the flat region, the distance h1 between the anode 2 and the cathode 3 of the light-emitting element 1 in the curved region is increased, that is, the increase of the cavity length of the microcavity of the light-emitting element 1 in the curved region is realized. Based on the above analysis, it is possible that light in a larger wavelength range may satisfy the resonance condition and be emitted from the curved region, thereby increasing the spectral range of the light emitted from the curved region. Therefore, when the user views the image at the observation angle corresponding to the curved region, light in a larger spectral range may be observed, thereby at least partially overcoming the problem of spectrum movement under different observation angles due to the microcavity effect in the prior art and avoiding color shifts in the viewed image to a certain extent. Therefore, by using the OLED display panel provided by the present disclosure, the display effect of the curved region may be improved to a certain extent, thereby further improving the display performance of the OLED display panel.

In the following, through some embodiments of the present disclosure, the structures of the corresponding OLED display panel are described in detail in cases where the distance between the anode 2 and the cathode 3 of the light-emitting element 1 in the curved region is increased in different manners.

It may be understood that at least one functional layer is disposed between the anode 2 and the cathode 3 of each light-emitting element 1. In some embodiments, the distance between the anode 2 and the cathode 3 of the light-emitting element 1 in the curved region may be increased by increasing the total thickness of the functional layer included in the light-emitting element 1 in the curved region, such that the distance between the anode 2 and the cathode 3 of the light-emitting element 1 in the curved region is larger than the distance between the anode 2 and the cathode 3 of the light-emitting element 1 in the flat region.

In a conventional OLED display panel, the functional layer included in the light-emitting element 1 in each of the curved region and the flat region includes only one layer of film. In some embodiments of the present disclosure, in order to increase the total thickness of the functional layer included in the light-emitting element 1 in the curved region, in addition to a basic functional layer included in each functional layer, the functional layer in the curved region may further include a first thickening layer having the same function as the corresponding basic functional layer. For example, when an organic light emitting layer is disposed between the anode 2 and the cathode 3 of each light-emitting element 1, the organic light emitting layer of the light-emitting element 1 in the curved region includes both a basic functional layer and a first thickening layer, whereas the organic light emitting layer of the light-emitting element 1 in the flat region includes only a basic functional layer. By adding a first thickening layer, the thickness of the organic light-emitting layer in the curved region may be increased, and in turn the distance between the anode 2 and the cathode 3 of the light-emitting element 1 in the curved region may be increased.

Of course, for the basic functional layers having the same function, they may be separately formed in the curved region and the flat region by two patterning processes during the manufacturing process, or may also be formed simultaneously in the curved region and the flat region by one patterning process. When the basic functional layers having the same function in the curved region and the flat region are formed by one patterning process, not only the process steps may be reduced, but also the number of used masks may be reduced, thereby lowering the production cost.

It should be noted that the function of the first thickening layer is set to be the same as the corresponding basic functional layer such that the formed first thickening layer does not affect the performance of the functional layer in which the first thickening layer is located, and does not affect the normal light emission of the light-emitting element 1. Specifically, the first thickening layer may be a single-layered film structure or a multi-layered film structure as long as the first thickening layer can play a role of thickening.

Figure 3:
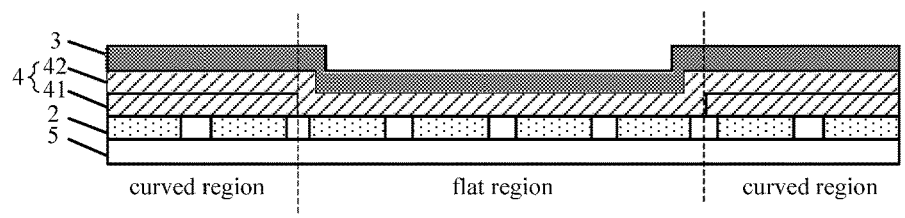
FIG. 3 is a schematic structural diagram of another OLED display panel according to an embodiment of the present disclosure.

Taking the organic light-emitting layer 4 provided between the anode 2 and the cathode 3 of each light-emitting element 1 as an example, when the first thickening layer is a single-layered film structure, as shown in FIG. 3, the detailed structure of the OLED display panel provided by the present disclosure is as follows: the anode 2 is formed on a surface of the substrate 5; a first thickening layer 41 of the organic light emitting layer is formed by one patterning process on a surface of the anode 2 in the curved region facing away from the substrate 5; and a basic functional layer 42 of the organic light emitting layer is then formed on a surface of the first thickening layer 41 of the organic light emitting layer facing away from anode 2 and on a surface of anode 2 in the flat region facing away from substrate 5 by another patterning process. In addition, a cathode 3 is further formed on a surface of the basic functional layer 42 of the organic light emitting layer facing away from the anode 2.

When the first thickening layer is a multi-layered film structure, optionally, the multi-layered film included in the first thickening layer may be formed through a plurality of patterning processes, so that the coverage areas of the orthographic projections of the multi-layered film on the substrate are increased in a gradient manner. For example, in a region of the curved region where the curvature is the largest (the portion with the greatest bending degree), a first mask is used to form the first layer of film included in the first thickening layer through vapor deposition process, and then the second mask to the nth mask with gradually expanded deposition areas are used to form the second to nth layers of film included in the first thickening layer, respectively, wherein the nth layer of film has an orthographic projection on the substrate corresponding to the curved region.

Figure 4:
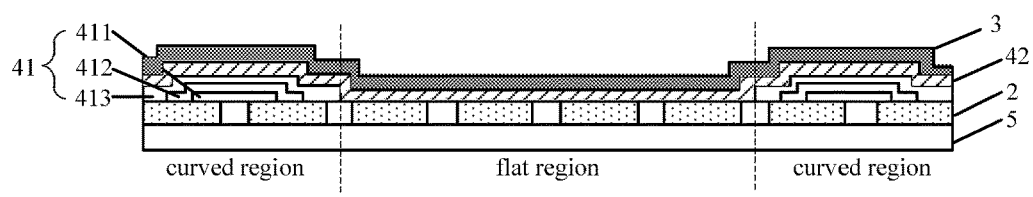
FIG. 4 is a schematic structural diagram of another OLED display panel according to an embodiment of the present disclosure.
Figure 13:
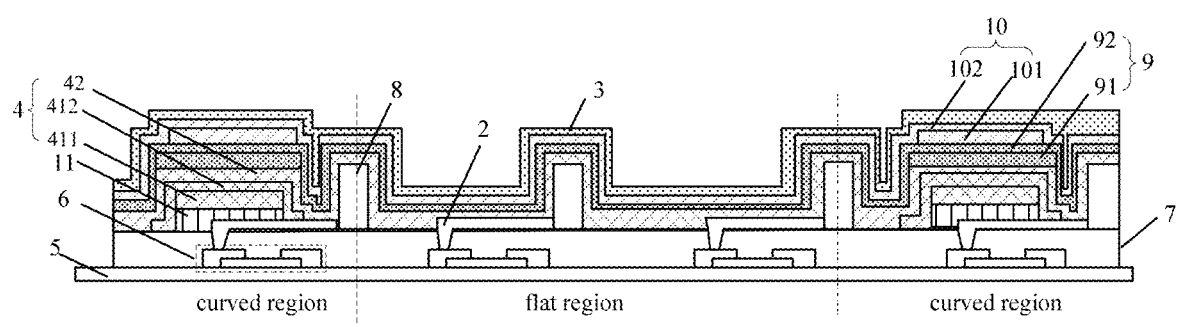
FIG. 13 is a schematic structural diagram of yet another OLED display panel according to an embodiment of the present disclosure.

Exemplarily, as shown in FIG. 4 and FIG. 13, taking the first thickening layer including three layers of film as an example, a specific structure of the first thickening layer 41 of the organic light-emitting layer is as follows: the first thickening layer 41 of the organic light-emitting layer includes a first layer of film 411, a second layer of film 412 and a third layer of film 413 stacked on a surface of the anode 2 facing away from the substrate 5 in the curved region. The orthographic projection of the first layer of film 411 on the substrate 5 corresponds only to the portion in the curved region the curvature of which is the largest (corresponding to the middle portion of the curved region in FIG. 4 and FIG. 13), and coverage areas of the orthographic projections of the second layer of film 412 and the third layer of film 413 on the substrate 5 are sequentially increased, wherein the orthographic projection of the third layer of film 413 on the substrate 5 corresponds to the complete curved region. After the third layer of film 413 of the first thickening layer is formed, the basic functional layer 42 of the organic light emitting layer is formed on a surface of the third layer of film 413 facing away from the anode 2 and on a surface of the anode 2 in the flat region facing away from the substrate 5. Further, the cathode 3 is formed on the surface of the basic functional layer 42 of the organic light emitting layer facing away from the anode 2.

It should be noted that, in practical applications, in the portion where the curvature is relatively large in the curved region of the OLED display panel, the microcavity effect has a greater influence on the intensity and wavelength of the emitted light. Therefore, when viewing the image under the observation angle corresponding to the portion with a greater curvature, the color shift in the observed image will be relatively significant. The thickness of the first thickening layer formed in the above manner is sequentially reduced from the middle portion with the larger curvature to the portion with the smaller curvature at both sides. That is, in the entire curved region, the first thickening layer in the portion with a greater curvature has a larger thickness, i.e. the cavity length of the microcavity in this portion is longer. In this way, the light in a larger wavelength range may satisfy the resonance condition and may be emitted from the portion with a larger curvature, thereby further avoiding the color shift.

When the first thickening layer includes a plurality of laminated layers of film, the coverage areas of the orthographic projections of the layers of film on the substrate 5 may be increased in a gradient manner as shown in FIG. 4 and FIG. 13 or may be decreased in a gradient manner. In fact, only one of the plurality layers of film included in the first thickening layer needs to have the orthographic projection on the substrate 5 corresponding to the entire curved region, so that the thickness of the functional layer in the entire curved region may be increased in relation to the flat region.

It should be noted that the first thickening layer of the functional layer may be formed between the corresponding basic functional layer and the anode 2, or may be formed between the corresponding basic functional layer and the cathode 3. There is no specific limitation to this in the present disclosure.

Exemplarily, in case where a hole transport layer 9, an organic light emitting layer 4, and an electron transport layer 10 are respectively included between the anode 2 and the cathode 3 of the light-emitting element 1 in each of the curved region and the flat region, the structure of the provided OLED display panel of the present disclosure is described in detail with reference to FIG. 5 and FIG. 13 as follows.

On the surface of the substrate 5, there are sequentially formed a plurality of switching units 6 in one-to-one correspondence with a plurality of pixels, a planarization layer 7 covering the switching units 6 and the substrate 5, a plurality of anodes 2 each connected to each of the plurality of switching units 6, and a pixel defining layer 8 for defining pixel regions. Among them, the switching unit 6 may specifically be a thin film transistor structure.

On the surface of the anode 2 in the curved region facing away from the substrate 5, a first thickening layer 91 of the hole transport layer is formed. On a surface of the first thickening layer 91 of the hole transport layer facing away from the anode 2, a basic functional layer 92 of the hole transport layer is formed by one patterning process. Here, the orthographic projection of the formed basic functional layer 92 of the hole transport layer on the substrate 5 corresponds to the curved region and the flat region.

On a surface of the basic functional layer 92 of the hole transport layer facing away from the substrate 5, in a portion corresponding to the curved region, a first thickening layer 41 of the organic light emitting layer is formed. On a surface of the first thickening layer 41 of the organic light-emitting layer facing away from the substrate 5, a basic functional layer 42 of the organic light-emitting layer is formed. Here, the orthographic projection of the formed basic functional layer 42 of the organic light emitting layer on the substrate 5 corresponds to the curved region and the flat region.

On a surface of the basic functional layer 42 of the organic light emitting layer facing away from the substrate 5, in a portion corresponding to the curved region, a first thickening layer 101 of the electron transport layer is formed. On a surface of the first thickening layer 101 of the electron transport layer facing away from the substrate 5, a basic functional layer 102 of the electron transport layer is formed. Here, the orthographic projection of the formed basic functional layer 102 of the electron transport layer on the substrate 5 covers the curved region and the flat region. Finally, on a surface of the basic functional layer 102 of the electron transport layer facing away from the first thickening layer 101 in the first region, a cathode 3 is formed, and an orthographic projection of the formed cathode 3 on the substrate 5 corresponds to the curved region and the flat region.

It should be noted that when the hole transport layer 9 and the electron transport layer 10 are formed, since the first thickening layer and the basic functional layer thereof are both a complete film, the hole transport layer 9 and the electron transport layer 10 may be formed by open metal masks. Specifically, the first thickening layer 91 of the hole transport layer and the first thickening layer 101 of the electron transport layer are formed through a first open metal mask, and the basic functional layer 92 of the hole transport layer and the basic functional layer 102 of the electron transport layer are formed through a second open metal mask. Here, the extent of opening of the first open metal mask is different from that of the second open metal mask.

Likewise, when the organic light emitting layer in the light-emitting element 1 is a white-light organic light emitting layer, the first thickening layer of the white-light organic light emitting layer is formed by a first open metal mask, and the basic functional layer of the white-light organic light emitting layer is formed by a second open metal mask. When the organic light-emitting layer in the light emitting element 1 is a RGB organic light emitting layer, the RGB organic light emitting layer needs to be set separately with respect to each pixel. Therefore, when the RGB organic light emitting layer is formed, a fine metal mask (abbreviated as FMM) is required. Specifically, the first thickening layer of the RGB organic light emitting layer is formed by a first fine metal mask, and the basic functional layer of the RGB organic light emitting layer is formed by a second fine metal mask. Here, the extent of opening of the first fine metal mask is different from that of the second fine metal mask.

Figure 5:
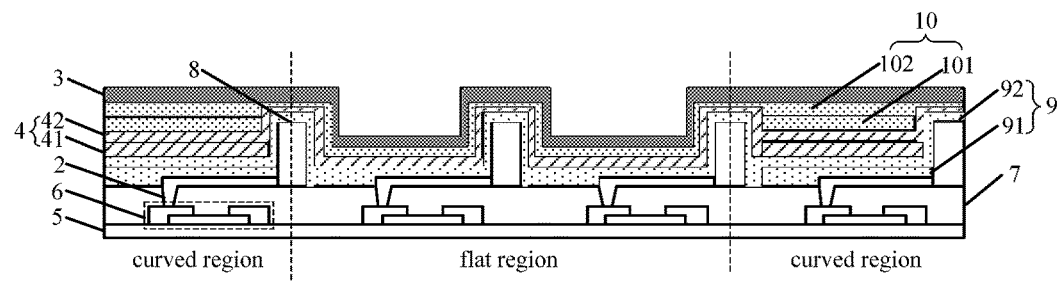
FIG. 5 is a schematic structural diagram of another OLED display panel according to an embodiment of the present disclosure.

In addition, it should be noted that the structure of the OLED display panel shown in FIG. 5 and FIG. 13 is only for illustrative purposes. In the OLED display panel provided by the present disclosure, other layers, such as a hole injection layer and an electron injection layer, may also be provided between the anode 2 and the cathode 3 of the light-emitting element 1, and the present disclosure does not specifically limit the type of the functional layer provided between the anode 2 and the cathode 3 of the light-emitting element 1. Moreover, in the functional layers provided between the anode 2 and the cathode 3 of the light-emitting element 1, it suffices that a first thickening layer be included in the curved region of at least one functional layer. There is no specific limitation to the number of functional layers having the first thickening layer in the present disclosure.

In some embodiments, there is no need to adjust the structure of each functional layer in the curved region, and instead, a second thickening layer 11 is formed between the anode 2 and the cathode 3 in the curved region so as to increase the distance between the anode 2 and the cathode 3 of the light-emitting element 1 in the curved region in relation to the flat region.

Optionally, the second thickening layer 11 may be formed between the anode 2 and the functional layer in the curved region, and may also be formed between the functional layer and the cathode 3 in the curved region.

Figure 6:
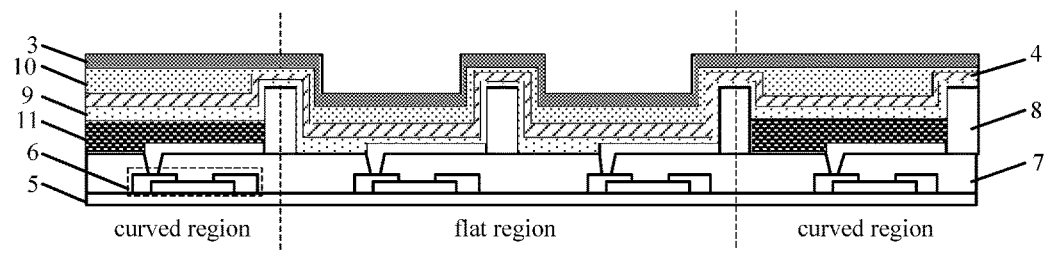
FIG. 6 is a schematic structural diagram of another OLED display panel according to an embodiment of the present disclosure.

Exemplarily, assuming that a hole transport layer 9, the organic light emitting layer 4 and an electron transport layer 10 are respectively provided between the anode 2 and the cathode 3 of the light-emitting element 1 in each of the curved region and the flat region, with reference to FIG. 6 and FIG. 13, taking the second thickening layer 11 being formed between the anode 2 and the functional layer in the curved region as an example, the structure of the OLED display panel provided by the present disclosure is specifically described as follows.

On a surface of the substrate 5, there are sequentially formed a plurality of switching units 6 in one-to-one correspondence to a plurality of pixels, a planarization layer 7 covering the switching units 6 and the substrate 5, a plurality of anodes 2 each connected to each of the plurality of switching units 6, and a pixel defining layer 8 for defining pixel regions.

On a surface of the anode 2 in the curved region facing away from the substrate 5, the second thickening layer 11 is formed. On a surface of the second thickening layer 11 facing away from the substrate 5, the hole transport layer 9 is formed by one patterning process. On a surface of the hole transport layer 9 facing away from the substrate 5, the organic light-emitting layer 4 is formed by one patterning process. On a surface of the organic light-emitting layer 4 facing away from the substrate 5, the hole transport layer 10 is formed by one patterning process. On a surface of the hole transport layer 10 facing away from the substrate 5, the cathode 3 is formed. Here, the orthographic projections of the formed hole transport layer 9, the organic light emitting layer 4, the electron transport layer 10, and the cathode 3 on the substrate 5 each correspond to the curved region and the flat region.

When the functional layers included in the light-emitting elements in the curved region and the flat region are both conventionally configured, by adding the second thickening layer 11 between the anode 2 and the cathode 3 of the light-emitting element 1 in the curved region, the distance between the anode 2 and the cathode 3 of the light-emitting element 1 in the curved region may be increased in relation to the flat region, so that the distance between the anode 2 and the cathode 3 of the light-emitting element 1 in the curved region is greater than the distance between anode 2 and cathode 3 of the light-emitting element 1 in the flat region.

Optionally, the second thickening layer 11 may be a grating made of a photoresist material. When the second thickening layer 11 is a grating, the height of the grating affects the distance between the anode 2 and the cathode 3 of the light-emitting element 1 in the curved region, i.e. the cavity length of the microcavity. In order to ensure that the grating can significantly increase the cavity length of the microcavity, the grating height may be set to 30 nm to 105 nm. Further, in order to avoid the phenomenon of tip discharge caused by excessive height of the grating, the height of the grating is preferably 50 nm to 60 nm. When the height of the grating is 50 nm to 60 nm, not only can the cavity length of the microcavity be significantly increased so that light of a larger wavelength may be emitted from the microcavity, but also can the tip discharge phenomenon be avoided so as to avoid adverse effects on the light-emitting element 1.

Figure 7:
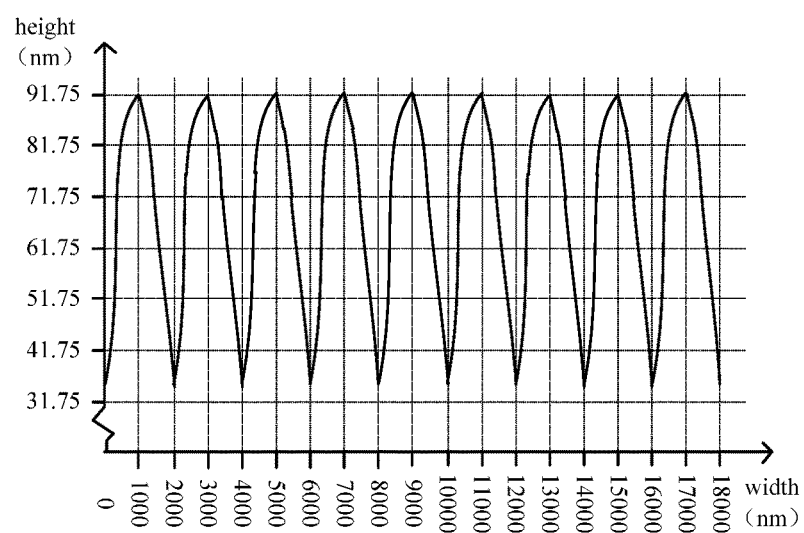
FIG. 7 is a schematic structural cross-sectional view of a grating in an OLED display panel according to an embodiment of the present disclosure.

At the same time, the period of the grating can be preferably 1 μm to 10 μm. When the period of the grating is 1 μm~10 μm, it may ensure that the grating has enough undulation, so that the cavity length may have a significant change, thereby significantly broadening the spectral range of the light emitted from the microcavity. A schematic cross-sectional structure of an exemplary grating is shown in FIG. 7.

In addition, since the grating includes a large number of slits, the surface shape thereof is uneven, and thus the structure formed on a surface of the grating facing away from the substrate may be uneven. Therefore, when the grating is formed between the anode 2 and the functional layer in the curved region, a hole injection material or a hole transport material may be filled in the recesses of the grating so as to ensure that the grating has a smooth surface, such that the functional layer formed on the surface of the grating facing away from the anode 2 has a flat surface. When the grating is formed between the functional layer and the cathode 3 in the curved region, an electron injection material or an electron transport material may be filled in the recesses of the grating, so that the cathode 3 formed on the surface of the grating facing away from the functional layer has a smooth surface. At the same time, by filling the recesses of the grating with an electron injection material, an electron transport material, a hole injection material, or a hole transport material, and if necessary the filled material penetrates the grating in the thickness direction of the grating, it may ensures the normal operation of the light-emitting element while the material of the grating itself may not have the function of these filled materials.

It may be understood that other than the grating, the second thickening layer 11 may be any layer which does not affect the light emitting performance of the light-emitting element 1, and there is no specific limitation to this in the present disclosure.

Figure 1:
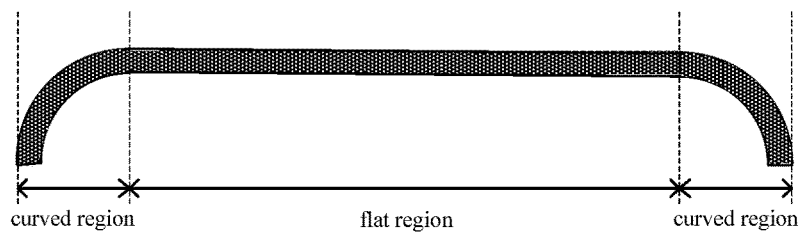
FIG. 1 is a schematic view of an OLED display panel having a curved edge.

It should be noted that the structure of the OLED display panel shown in FIG. 2 to FIG. 6 and FIG. 13 is merely for illustrative purposes. The curved region in the figures does not show a curved state in order to allow a clearer and more apparent comparison of the distance between the anode and the cathode in the curved region and the distance between the anode and the cathode in the flat region. It is mentioned that, the embodiment of FIG. 13 may be a combination of the embodiments of FIG. 4, FIG. 5 and FIG. 6, and thus includes all the features and advantages of the embodiments of FIG. 4, FIG. 5 and FIG. 6. It may be understood that, in practical applications, the curved region of the OLED display panel should be in a curved state, as shown in FIG. 1, for example.

The present disclosure provides a method for manufacturing an OLED display panel. The method for manufacturing an OLED display panel may be used to manufacture an OLED display panel according to the present disclosure.

Figure 8:
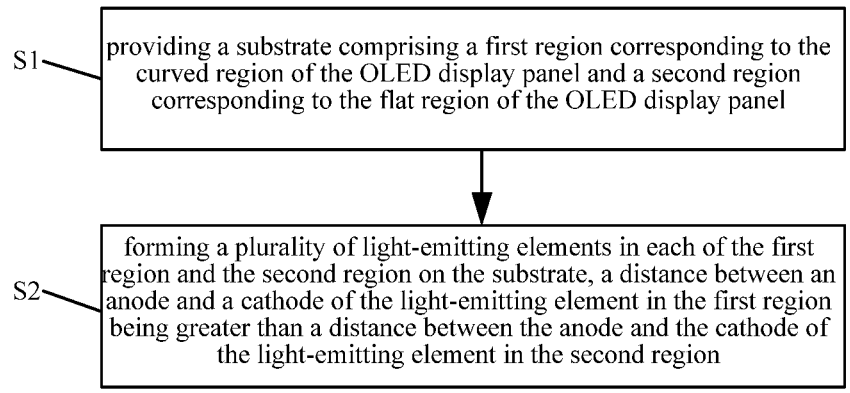
FIG. 8 is a flowchart of a method for manufacturing an OLED display panel according to an embodiment of the present disclosure.

As shown in FIG. 8, the method for manufacturing the OLED display panel specifically includes:

Step S1: providing a substrate comprising a first region corresponding to the curved region of the OLED display panel and a second region corresponding to the flat region of the OLED display panel;

Step S2: forming a plurality of light-emitting elements in each of the first region and the second region on the substrate, a distance between an anode and a cathode of the light-emitting element in the first region being greater than a distance between the anode and the cathode of the light-emitting element in the second region.

According to the method for manufacturing the OLED display panel provided by the present disclosure, the distance between the anode and the cathode of the light-emitting element in the curved region is greater than the distance between the anode and the cathode of the light-emitting element in the flat region, that is, the cavity length of the microcavity of the light-emitting element in the curved region of the OLED display panel is accordingly increased. Based on the resonance principle of microcavity, when the cavity length of the microcavity is increased, light in a larger wavelength range can satisfy the resonance condition so as to be emitted out, thereby increasing the spectral range of the emitted light. In this way, when the user views the image at the observation angle corresponding to the curved region of OLED display panel, light in a larger spectral range may be observed, thereby at least partially overcoming the problem of the spectrum movement under different observation angles due to the microcavity effect in the prior art and avoiding color shifts in the viewed image to a certain extent.

Figure 9:
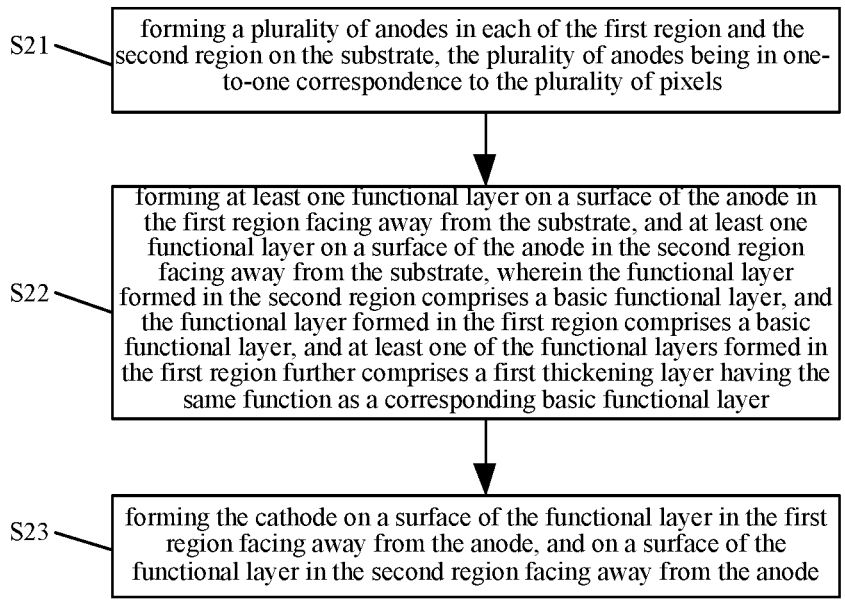
FIG. 9 is a flowchart of an exemplary method for manufacturing an OLED display panel according to an embodiment of the present disclosure.

Based on a structure of the OLED display panel provided by the present disclosure, as shown in FIG. 9, step S2 may specifically include:

Step S21: forming a plurality of anodes in each of the first region and the second region on the substrate, the plurality of anodes being in one-to-one correspondence to the plurality of pixels;

Step S22: forming at least one functional layer on a surface of the anode in the first region facing away from the substrate, and at least one functional layer on a surface of the anode in the second region facing away from the substrate, wherein the functional layer formed in the second region comprises a basic functional layer, and the functional layer formed in the first region comprises a basic functional layer, and at least one of the functional layers formed in the first region further comprises a first thickening layer having the same function as a corresponding basic functional layer; and Step S23: forming the cathode on a surface of the functional layer in the first region facing away from the anode, and on a surface of the functional layer in the second region facing away from the anode.

It should be noted that when the first thickening layer is a single-layered film structure, it may be formed by using a single mask through one patterning process. When the first thickening layer is a multi-layered film structure, it can be formed by using a plurality of masks having different opening ratios through multiple patterning processes. In addition, for the basic functional layers having the same function, they may be separately formed in the first region and the second region through two patterning processes, or they may be formed simultaneously in the first region and the second region through a single patterning process. When the basic functional layers having the same function in the first region and the second region is formed through one patterning process, not only the process steps may be reduced, but also the number of used masks may be reduced, thereby lowering the production cost.

Exemplarily, in case where the hole transport layer 9, the organic light emitting layer 4, and the electron transport layer 10 are respectively provided between the anode and the cathode of the light-emitting element in the first region and the second region, with reference to FIG. 10, a method of manufacturing an OLED display panel provided by the present disclosure is described in detail as follows.

Step H1: providing a substrate 5, and forming a plurality of switching units 6 on a surface of the substrate 5, wherein the formed plurality of switching units 6 are in one-to-one correspondence to the plurality of pixels.

Step H2: forming a planarization layer 7 on a surface of the switching units 6 facing away from the substrate 5, wherein the formed planarization layer 7 covers the switching units 6 and the substrate 5.

Step H3: forming a plurality of anodes 2 on a surface of the planarization layer 7 facing away from the switching units 6, wherein the anodes 2 are in one-to-one electrical connection to the switching units 6, i.e. anodes 2 are in one-to-one correspondence to the pixels.

Step H4: forming a pixel defining layer 8 for defining pixel regions on the surface of the planarization layer 7 facing away from the switching units 6.

Step H5: forming a first thickening layer 91 of the hole transport layer on the surface of the anode 2 in the first region facing away from the substrate 5 by a first open metal mask through vapor deposition; forming a basic functional layer 92 of the hole transport layer on a surface of the first thickening layer 91 of the hole transport layer facing away from the anode 2 and on a surface of the anode 2 in the second region facing away from the substrate 5 by a second open metal mask through vapor deposition. Here, the orthographic projection of the formed basic functional layer 92 of the hole transport layer on the substrate 5 corresponds to the first region and the second region.

Step H6: forming a first thickening layer 41 of the organic light emitting layer by vapor deposition, on a surface of the basic functional layer 92 of the hole transport layer facing away from the substrate 5, in a portion corresponding to the first region; forming a basic functional layer 42 of the organic light-emitting layer by vapor deposition, on a surface of the first thickening layer 41 of the organic light-emitting layer facing away from the substrate 5 and on a surface of the basic functional layer 92 of the hole transport layer facing away from the substrate 5 in the second region. Here, the orthographic projection of the formed basic functional layer 42 of the organic light emitting layer on the substrate 5 corresponds to the first region and the second region.

Step H7: forming a first thickening layer 101 of the electron transport layer by a first open metal mask through vapor deposition, on a surface of the basic functional layer 42 of the organic light emitting layer facing away from the substrate 5, in a portion corresponding to the first region; forming a basic functional layer 102 of the electron transport layer by a second open metal mask through vapor deposition, on a surface of the first thickening layer 101 of the electron transport layer facing away from the substrate 5 and a surface of the basic functional layer 42 of the organic light emitting layer facing away from the substrate 5 in the second region. Here, the orthographic projection of the formed basic functional layer 102 of the electron transport layer on the substrate 5 covers the first region and the second region.

Step H8: forming the cathode 3, on a surface of the basic functional layer 102 of the electron transport layer facing away from the first thickening layer 101 in the first region and on a surface of the basic functional layer 102 of the electron transport layer facing away from the substrate 5 in the second region. Here, an orthographic projection of the formed cathode 3 on the substrate 5 corresponds to the first region and the second region.

It should be noted that when the organic light-emitting layer 4 is an RGB organic light-emitting layer, the first thickening layer of the RGB organic light emitting layer is formed by a first fine metal mask through vapor deposition, and the basic functional layer of the RGB organic light emitting layer is formed by a second fine metal mask through vapor deposition. When the organic light emitting layer 4 is a white-light organic light emitting layer, the first thickening layer of the white-light organic light emitting layer is formed by a first open metal mask through vapor deposition, and the basic functional layer of the white-light organic light emitting layer is formed by a second open metal mask through vapor deposition.

Figure 11:
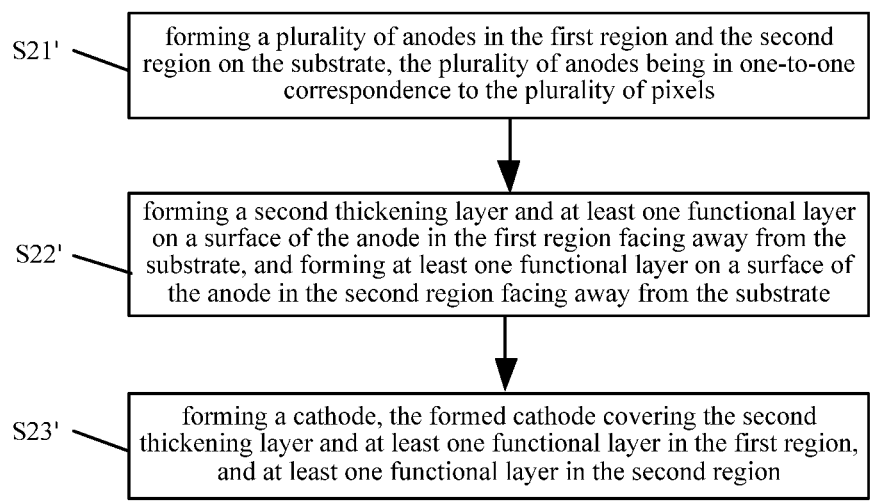
FIG. 11 is a flowchart of another exemplary method for manufacturing an OLED display panel according to an embodiment of the present disclosure.

Based on another structure of the OLED display panel provided by the present disclosure, as shown in FIG. 11, step S2 may specifically include:

Step S21': forming a plurality of anodes in the first region and the second region on the substrate, the plurality of anodes being in one-to-one correspondence to the plurality of pixels.

Step S22': forming a second thickening layer and at least one functional layer on a surface of the anode in the first region facing away from the substrate, and forming at least one functional layer on a surface of the anode in the second region facing away from the substrate.

Step S23': forming a cathode, the formed cathode covering the second thickening layer and at least one functional layer in the first region, and at least one functional layer in the second region.

With this manufacturing method, there is no need to adjust the structure of each functional layer in the curved region, and instead, a second thickening layer 11 is formed between the anode 2 and the cathode 3 in the curved region so as to increase the distance between the anode 2 and the cathode 3 of the light-emitting element 1 in the curved region in relation to the flat region.

Here, when the second thickening layer is located between the anode and the functional layer in the first region, step S22' may specifically include:

Step S221': forming a second thickening layer on a surface of the anode in the first region facing away from the substrate.

Step S222': forming at least one functional layer, on a surface of the second thickening layer facing away from the anode and on a surface of the anode in the second region facing away from the substrate.

When the second thickening layer is located between the functional layer and the cathode in the first region, step S22' may specifically include:

Step S221": forming at least one functional layer on a surface of the anode in each of the first region and the second region facing away from the substrate.

Step S222": forming a second thickening layer on a surface of the functional layer in the first region facing away from the anode.

Figure 12:
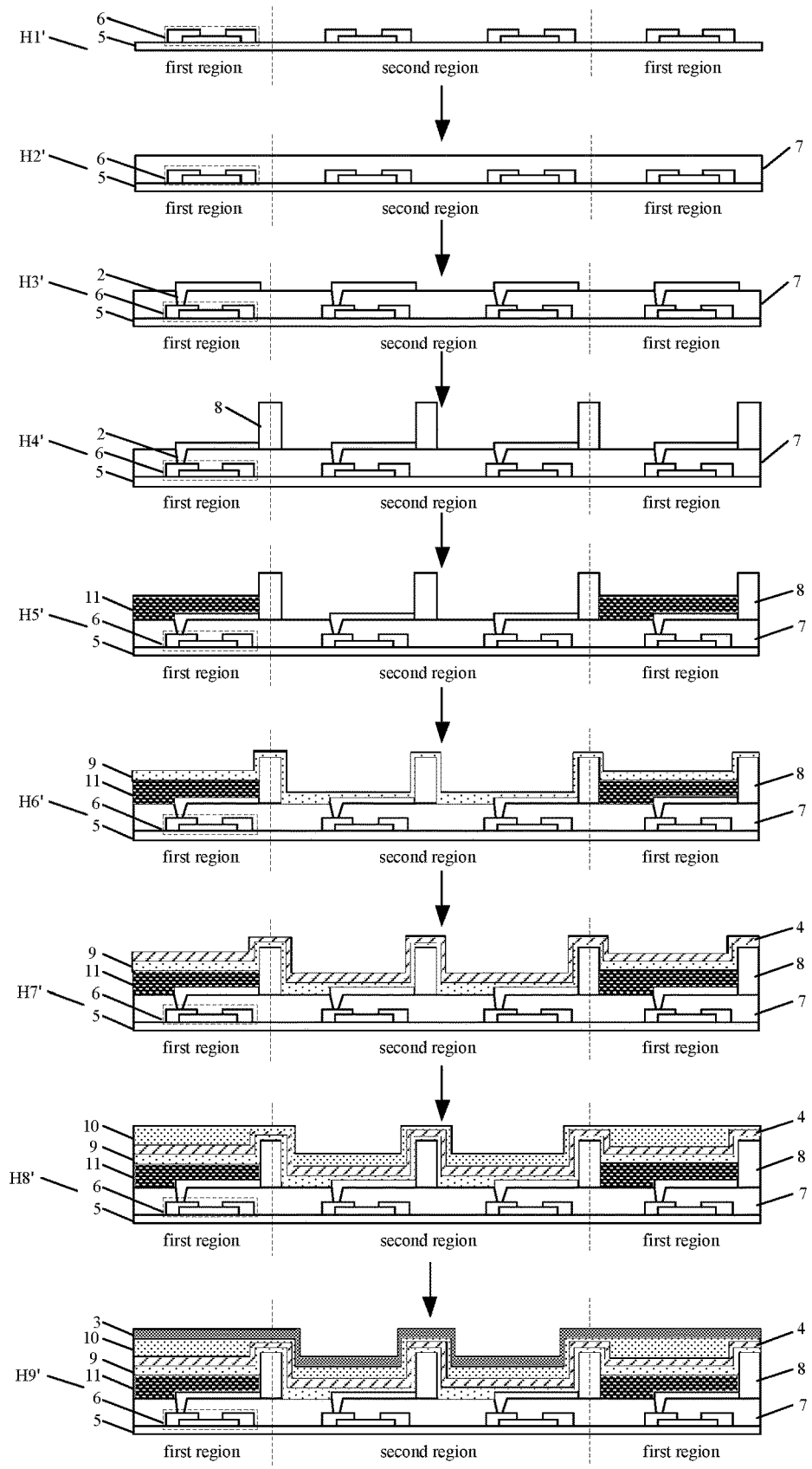
FIG. 12 is a schematic diagram of steps of another exemplary method for manufacturing an OLED display panel according to an embodiment of the present disclosure.

Exemplarily, in case where the hole transport layer 9, the organic light emitting layer 4, and the electron transport layer 10 are respectively provided between the anode and the cathode of the light-emitting element in the first region and the second region, with reference to FIG. 12, taking the second thickening layer 11 located between the anode 2 and the functional layer in the first region as an example, a method of manufacturing an OLED display panel provided by the present disclosure is described in detail as follows.

Step H1': providing a substrate 5, forming a plurality of switching units 6 on a surface of the substrate 5, the formed plurality of switching units 6 being in one-to-one correspondence to a plurality of pixels.

Step H2': forming a planarization layer 7 on a surface of the switching unit 6 facing away from the substrate 5, wherein the formed planarization layer 7 covers the switching units 6 and the substrate 5.

Step H3': forming a plurality of anodes 2 on a surface of the planarization layer 7 facing away from the switching units 6, wherein anodes 2 are in one-to-one electrical connection to the switching units 6, i.e. anodes 2 are in one-to-one correspondence to the pixels.

Step H4': forming a pixel defining layer 8 for defining pixel regions on the surface of the planarization layer 7 facing away from the switching units 6.

Step H5': forming a second thickening layer 11 on a surface of the anode 2 in the first region facing away from the substrate 5.

Step H6': forming the hole transport layer 9 by the second open metal mask through vapor deposition, on a surface of the second thickening layer 11 facing away from the substrate 5, and on a surface of the anode 2 in the second region facing away from the substrate 5, wherein the orthographic projection of the formed hole transport layer 9 on the substrate 5 covers the first region and the second region.

Step H7': forming the organic light-emitting layer 4 by a second fine metal mask or a second open metal mask through vapor deposition, on a surface of the hole transport layer 9 facing away from the substrate 5, wherein the orthographic projection of the formed organic light-emitting layer 4 on the substrate 5 covers the first region and the second region.

Step H8': forming the electron transport layer 10 by the second open metal mask through vapor deposition, on a surface of the organic light-emitting layer 4 facing away from the substrate 5, wherein the orthographic projection of the formed electron transport layer 10 on the substrate 5 covers the first region and second region.

Step H9': forming a cathode 3 on the surface of the electron transport layer 10 facing away from the substrate 5, wherein the orthographic projection of the formed cathode 3 on the substrate 5 covers the first region and the second region.

The second thickening layer may be a grating with a height of 50 nm to 60 nm formed from a photoresist material, and may also be any other layer that does not affect the light emitting performance of the light-emitting element, and is not specifically limited in the present disclosure.

Figure 10:
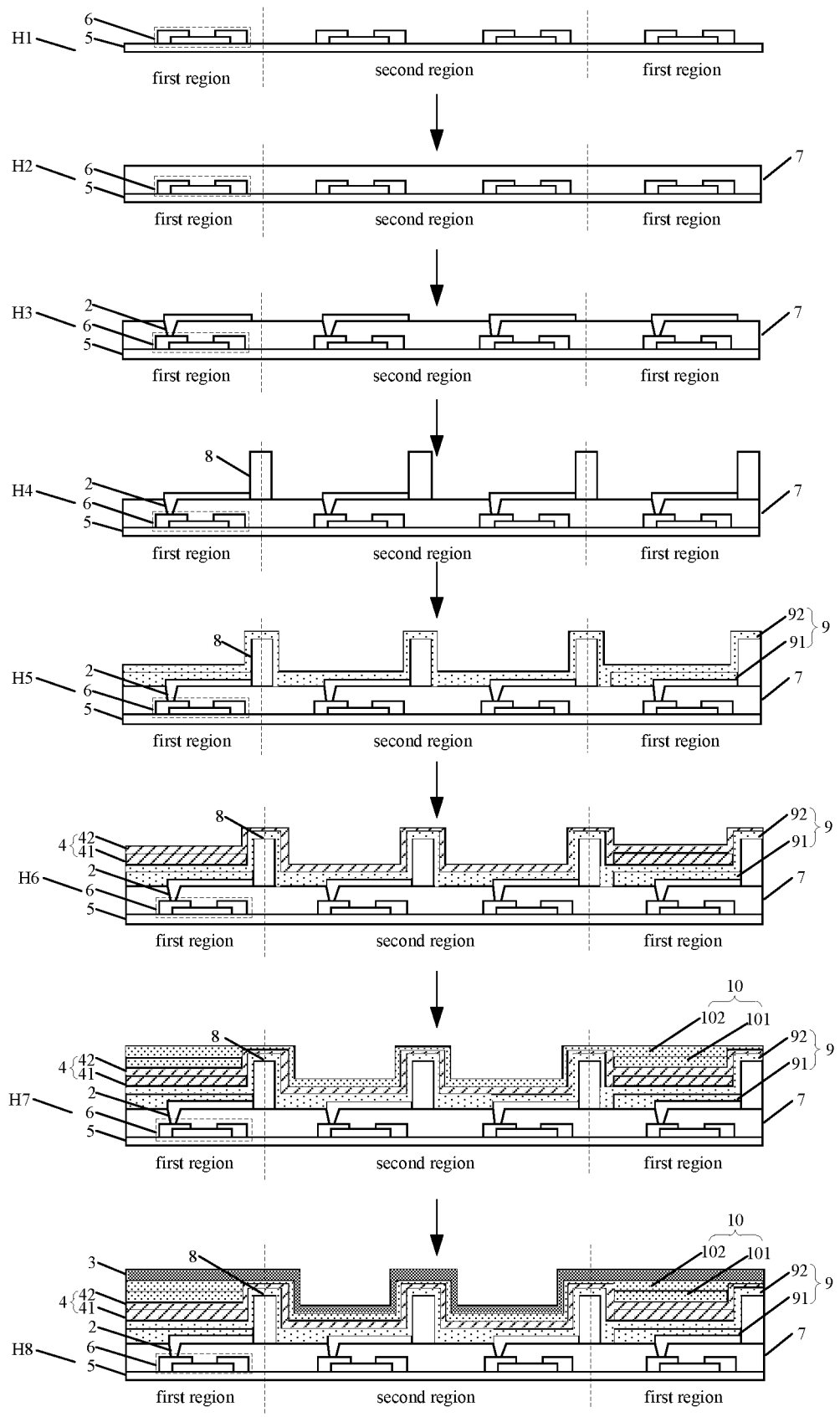
FIG. 10 is a schematic diagram of steps of an exemplary method for manufacturing an OLED display panel according to an embodiment of the present disclosure.

It should be noted that the structures of the OLED display panel shown in FIGS. 10 and 12 are merely for illustrative purposes. The first region (corresponding to the curved region of the OLED display panel) in the figures does not show a curved state in order to allow a clearer and more apparent comparison of the distance between the anode and the cathode in the first region and the distance between the anode and the cathode in the second region (corresponding to the flat region of the OLED display panel). It may be understood that, in practical applications, the curved region of the OLED display panel should be in a curved state.

The present disclosure further provides an OLED display device including the OLED display panel as described in the present disclosure.

Compared with the existing OLED display device, since the OLED display device provided by the present disclosure includes the OLED display panel as described in the present disclosure, when the user views the image at the observation angle corresponding to the curved region by using the OLED display device in the present disclosure, the light in a larger spectral range may be seen, and the color shift of the image may be avoided to a certain extent, thereby improving the display performance of the OLED display device.

The foregoing descriptions are merely specific implementations of the present disclosure, but the scope of protection of the present disclosure is not limited thereto, and any changes or replacements that may be easily conceived by those skilled in the art within the technical scope disclosed by the present disclosure should be within the protection scope of the present disclosure. Therefore, the protection scope of the present disclosure should be based on the protection scope of the claims.

What is claimed is:

1. An OLED display panel comprising a flat region and a curved region, wherein the OLED display panel comprises a light-emitting element in the flat region and a light-emitting element in the curved region, and wherein:
   each light-emitting element comprises a cathode and an anode, and
   a distance between the anode and the cathode of light-emitting element in the curved region is greater than a distance between the anode and the cathode of the light-emitting element in the flat region;
   the OLED display panel further comprises: a hole transport layer, an organic light emitting layer and an electron transport layer respectively included between the anode and the cathode of the light-emitting elements in each of the curved region and the flat region, wherein:
   the hole transport layer comprises a basic functional layer of the hole transport layer and a first thickening layer of the hole transport layer wherein an orthographic projection of the basic functional layer of the hole transport layer on the substrate is within both the curved region and the flat region and an orthographic projection of the first thickening layer of the hole transport layer on the substrate is within only the curved region;
   the organic light emitting layer comprises a basic functional layer of the organic light emitting layer and a second thickening layer of the organic light emitting layer, wherein an orthographic projection of the basic functional layer of the organic light emitting layer on the substrate is within both the curved region and the flat region, and an orthographic projection of the second thickening layer of the organic light emitting layer on the substrate is within only the curved region;
   a total thickness of the organic light emitting layer in the curved region is greater than a total thickness of the organic light emitting layer in the flat region;
   the second thickening layer of the organic light emitting layer has a multi-layered film structure;
   the second thickening layer of the organic light emitting layer includes a first layer of film, a second layer of film and a third layer of film stacked on a surface of the anode in the curved region, wherein an orthographic projection of the second layer of film on the anode corresponds only to a portion in the curved region having a largest amount of curvature, and coverage areas of orthographic projections of the second layer of film and the third layer of film on the anode of the curved region are sequentially increased or decreased;

the orthographic projection of the third layer of film on the anode in the curved region corresponds to an entirety of the curved region; and the electron transport layer comprises a basic functional layer of the electron transport layer and a third thickening layer of the electron transport layer, wherein an orthographic projection of the basic functional layer of the electron transport layer on the substrate is within both the curved region and the flat region, and an orthographic projection of the third thickening layer of the electron transport layer on the substrate is within only the curved region;

a fourth thickening layer is further formed between the anode and the cathode of the light-emitting element in the curved region;

the fourth thickening layer is located between the anode and the organic light emitting layer in the curved region, or the fourth thickening layer is located between the cathode and the organic light emitting layer in the curved region;

the fourth thickening layer is a grating; and the third thickening layer of the electron transport layer is directly attached to the basic functional layer of the organic light emitting layer.

2. The OLED display panel according to claim 1, further comprising a substrate, wherein a surface of the substrate is formed with:

a pluraiity of switching units in one-to-one correspondence with the plurality of pixels in the flat region and in the curved region;

a planarization layer covering the switching units and the substrate;

a plurality of said anodes of the light-emitting elements connected to the plurality of switching units in one-to-one correspondence; and a pixel defining layer for defining pixel regions.

3. The OLED display panel according to claim 2, wherein the switching units comprise a thin film transistor structure.

4. The OLED display panel according to claim 1, wherein: the basic functional layer of the light emitting layer in the curved region and the flat region are formed by one patterning process.

5. The OLED display panel according to claim 1, wherein the grating has a height of 50 nm to 60 nm, and the grating has a period of 1 μm to 10 μm.

6. The OLED display panel according to claim 1, wherein the grating is filled with a hole injection material or a hole transport material, or the grating is filled with an electron injection material or an electron transport material.

7. The OLED display panel according to claim 1, wherein the distance between the anode and the cathode of the light-emitting element in the curved region is 1.1 to 3 times the distance between the anode and the cathode of the light-emitting element in the flat region.

8. An OLED display device comprising the OLED display panel according to claim 1.

* * * * *